US006589883B2

United States Patent
Gole et al.

(10) Patent No.: US 6,589,883 B2
(45) Date of Patent: Jul. 8, 2003

(54) ENHANCEMENT, STABILIZATION AND METALLIZATION OF POROUS SILICON

(75) Inventors: James L. Gole, Atlanta, GA (US); Lenward T. Seals, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/820,412

(22) Filed: Mar. 29, 2001

(65) Prior Publication Data

US 2001/0046785 A1 Nov. 29, 2001

Related U.S. Application Data

(60) Provisional application No. 60/192,845, filed on Mar. 29, 2000.

(51) Int. Cl.$^7$ ...................... H01L 21/302; H01L 21/461

(52) U.S. Cl. ...................................... 438/753; 438/960

(58) Field of Search ................................ 438/753, 960; 427/64, 157, 344

(56) References Cited

U.S. PATENT DOCUMENTS

| | | | | |
|---|---|---|---|---|
| 6,132,811 A | * | 10/2000 | Schellenberger | 427/443.2 |
| 6,136,684 A | * | 10/2000 | Sato et al. | 438/624 |
| 6,180,497 B1 | * | 1/2001 | Sato et al. | 438/458 |

OTHER PUBLICATIONS

Gole et al, Chloride Enhancement and Stabilization of Silicon, pp. 5615–5631, Feb. 2000.*
Gole et al, Patterned Metallization of porous Silicon, pp. 27–31, 2000.*
Gole, DeVincentis, and Seals; Chloride salt enhancement and stabiliation of the photoluminescence from a porous silicon surface; Feb. 15, 2000; Physical Review B; pp. 5615–5631.*
Prokes, Carlos, Seals and Gole; Defect study of light–emitting HCl–treated porous silicon; Jul. 15, 2000; Physical Review B; pp. 1878–1882.*
Gole, Seals and Lillehei; Patterned metallization fo porous silicon from electroless solution for direct electrical contact; 2000; Journal of the Electrochemical Society; pp. S-5-27-S-5-31.*
Gole, DeVincentis and Seals; Optical pumping of dye–complexed and sensitized porous silicon increasing photoluminescence emission rates; 1999; The Journal of Physical Cemistry B; pp. 979–987.*
Propst and Kohl; The Electrochemical Oxidation fo Silicon and Formation of Porous Silicon in Acetonitrile; Apr., 1994; J. Electrochem. Soc.; pp. 1006–1013.*
Prokes; Surface and optical properties of porous silicon; Feb., 1996; J. Mater. Res.; pp. 305–320.*
Collins, Fauchet and Tischler; Porous silicon: From luminescence to LEDS; Jan., 1997; Physics Today; pp. 24–31.*
Cullis, Canham and Calcott; The structural and luminescence properties of porous silicon; 1997; Applied Physics Reviews; pp. 909–965.*
Kanemitsu; Light emission from porous silicon and related materials; 1995; Physics Reports; pp. 1–91.*
Canham; Silicon quantum wire array fabrication by electrochemical and chemical dissolution of wafers; Sep., 1990; Appl. Phys. Letter; pp. 1046–1048.*
John and Singh; Porous silicon: Theoretical studies; 1995; Physics Reports; pp. 93–151.*
Koch, Petrova–Koch, Nikolov and Gavrilenko; Some perspectives on the luminescence mechanism via surface–confined states of porous Si; 1993; Mat. Res. Soc.; pp. 197–202.*
Koch, Petrova–Koch and Muschik; The luminescence of porous Si: the case for the surface state mechanism; 1993; Journal of Luminescence; pp. 271–281.*
Koch; Models and mechanisms for the luminescence of porous Si; 1993; Mat. Res. Soc.; pp. 319–329.*
Gole and Dixon; Transformation, green to orange–red, of a porous silicon photoluminescent surface in solution; 1998; The Journal of Physical Chemistry B; pp. 33–39.*
Gole and Dixon; Electrochemical methoxylation of an HF–Etched porous silcon surface; 1998; The Journal of Physical Chemistry B; pp. 1768–1774.
Gole, Dudel and Seals; On the correlation of aqueous and nonaqueous in situ and ex situ photoluminescent emissions from porous silicon; 1998; J. Electrochem. Soc.; pp. 3284–3300.
Dudel and Gole; Stabilization of the photoluminescence from porous silicon: the competition between photoluminescence and dissolution; 1997; J. Appl. Phys.; pp. 402–406.
Seals, Dudel, Grantier and Gole; Trends in the interaction fo the strong acids HCl, HBr, and HI with a photoluminescing porous silicon surface; 1997; The Journal of Physical Chemistry B; pp. 8860–8864.
Warntjes, Vieillard, Ozanam and Chazalviel; Electrochemical methozylation of porous silicon surface; Dec., 1995; J. Electrochem. Soc., pp. 4138–4142.

(List continued on next page.)

Primary Examiner—Alexander Ghyka
(74) Attorney, Agent, or Firm—Thomas, Kayden, Horstemeyer & Risley, LLP

(57) ABSTRACT

A post-etch treatment for enhancing and stabilizing the photoluminescence (PL) from a porous silicon (PS) substrate is outlined. The method includes treating the PS substrate with an aqueous hydrochloric acid solution and then treating the PS substrate with an alcohol. Alternatively, the post-etch method of enhancing and stabilizing the PL from a PS substrate includes treating the PS substrate with an aqueous hydrochloric acid and alcohol solution. Further, the PL of the PS substrate can be enhanced by treating the PS substrate with a dye. Furthermore, the PS substrate can be metallized to form a PS substrate with resistances ranging from 20 to 1000 ohms.

25 Claims, No Drawings

OTHER PUBLICATIONS

Gole, Dudel, Grantier and Dixon; Origin of porous silicon photoluminescence: Evidence for a surface bound oxyhydride–like emitter; Jul. 15, 1997; Physical Review B; pp. 2137–2153.

Dubin, Ozanam and Chazalviel; In situ liminescence and IR study of porous silicon during and after anodic oxidation; 1995; Thin Solid Films; pp. 87–91.

Koch and Kux; Prospects for infrared electroluminescence from porous silicon; 1993; Mat. Res. Soc.; pp. 391–396.

Fuchs, Rosenbauer, Brandt, Ernst, Finkbeiner, Stutzmann, Syassen, Weber, Queisser and Cardona; Visible luminescence from porous silicon and siloxene: recent results; 1993; Mat. Res. Soc.; pp. 203–208.

* cited by examiner

ENHANCEMENT, STABILIZATION AND METALLIZATION OF POROUS SILICON

CROSS-REFERENCE TO RELATED APPLICATION

This application claims priority to copending U.S. provisional application entitled, "Porous Silicon for Sensor Applications: Enhancement, Stabilization and Metallization," having Serial No. 60/192,845, filed Mar. 29, 2000, which is entirely incorporated herein by reference.

TECHNICAL FIELD

The present invention is generally related to porous silicon substrates and, more particularly, is related to a method for photoluminescence enhancement, photoluminescence stabilization, and the metallization of porous silicon substrates.

BACKGROUND OF THE INVENTION

High surface area porous silicon (PS) substrates formed in wafer scale through electrochemical (EC) etching fall into two groups. PS substrates fabricated from aqueous electrolytes consists of highly branched nonporous substrates while PS substrates fabricated from a nanoqueous electrolyte is comprised of open and accessible macroporous substrates with deep, wide, well-ordered channels.

High-surface area substrates formed in wafer scale through etching display a visible photoluminescence (PL) upon excitation (PLE) with a variety of visible and ultraviolet light sources. This room-temperature luminescence has attracted considerable attention primarily because of its potential use in the development of silicon-based optoelectronics, displays, and sensors.

Although the PL is thought to emanate from regions near the PS substrate surface, the origin of the PL is the source of some controversy as the efficiency and wavelength range of the emitted light can be affected by the physical and electronic properties of the surface, the nature of the etching solution, and the nature of the environment into which the etched sample is placed. Given this range of parameters, it is surprising that, with few exceptions, PL spectra are reported for PS substrates formed in dilute aqueous HF solutions, that have already been dried in air or more inert environments following etch and rinse treatments. These ex situ samples, while providing spectral information, do not indicate the evolution of the PS substrates, and thus, they do not indicate means by which it might be modified and enhanced during or following the etch treatment.

An existing problem in fabricating PS devices rests with establishing electrical contact to the PS substrates. Another problem with PS includes the relatively long excited-state lifetime associated with the PS substrate PL. A further problem includes the relatively low PL quantum yield and the instability of the PL from PS substrates.

Thus, a heretofore unaddressed need exists in the industry to address the aforementioned deficiencies and inadequacies.

SUMMARY OF THE INVENTION

An embodiment of the present invention provides for a post-etch treatment method of enhancing and stabilizing the PL from a PS substrate. The method includes treating the PS substrate with an aqueous hydrochloric acid ($HCl(H_2O)$) solution and then treating the PS substrate with an alcohol. Another exemplary embodiment provides a post-etch method of enhancing and stabilizing the PL from a PS substrate, which includes treating the PS substrate with an $HCl(H_2O)$ and alcohol solution.

Still another embodiment provides a post-etch method for metallizing a PS substrate in an electroless environment. The method includes treating the PS substrate with an $HCl(H_2O)$ solution and then treating the PS substrate with an alcohol, or alternatively, treating the PS substrate with a hydrochloric acid/alcohol solution. Subsequently, the PS substrate is treated a hydrazine solution to remove fluorides from the PS substrate. Next, a metal-containing electroless solution is introduced to the PS substrate. Thereafter, the PS substrate is illuminated with a light source at wavelengths less than about 750 nanometers to cause PL of the PS substrate. Then, the metal from the metal-containing solution is induced by the PL to reduce onto the PS substrate (e.g. metallization).

A further embodiment provides for a post-etch method of enhancing PL from a PS substrate by treating the PS substrate with a dye. The dye can be selected from the group including, but not limited to 3,3-diethyloxadicarbacyamine iodide; Rhodamine dye compounds; Fluorocein; and dicyanomethylene (DCM) dye compounds.

Still a further embodiment provides for a metallized PS substrate. The PS substrate can be metallized with copper, silver, or other appropriate metal and can have a resistance of about 20–100 ohm.

Other systems, methods, features, and advantages of the present invention will be or become apparent to one with skill in the art upon examination of the following detailed description. It is intended that all such additional systems, methods, features, and advantages be included within this description, be within the scope of the present invention, and be protected by the accompanying claims.

DETAILED DESCRIPTION OF THE PREFERRED EMBODIMENT

One of a number of embodiments of the present invention includes the treatment of PS substrates generated in an aqueous and nonaqueous etch with an $HCl(H_2O)$ solution, which results in the stabilization and enhancement of the in situ PL of the PS substrates. More specifically, in an exemplary embodiment, in a post-etch treatment method, an $HCl(H_2O)$ solution can be used to enhance and stabilize the PL (in situ) from a PS substrate. In addition, in an other exemplary embodiment, a method of treating the PS substrate with $HCl(H_2O)$ followed by an alcohol solution (e.g. methanol or ethanol) further enhances and stabilizes the PL (in situ and ex situ) of the substrate. A non-limiting illustrative example includes PS substrates that are treated in an aqueous hydrochloric acid and water ($HCl/H_2O$) solution and display a strongly enhanced in-situ luminescence; however, the PL decays rapidly in an ex-situ environment without treatment in alcohol, preferably a high purity alcohol. An exemplary embodiment includes treating the PS with methanol (MeOH). Further, PS substrates treated in an HCl ($H_2O$)/ alcohol solution (of at least 0.2 molar (M)) maintain their enhancement for extended periods of time. The PS substrate may be stabilized and enhanced by the presence of a chloride ion (Cl). The treatment appears to be independent of the method of preparing the PS substrate, implying that the chloride salt treatment largely stabilizes the surface states of the photoluminescent PS substrate. This stabilization may be demonstrated by various techniques including, but not limited to the following: scanning electron micrographs (SEM), which show the profound change which accompanies the HCl treatment of the PS surface;

Energy Dispersive Spectroscopy (EDS) which, reveals chloride incorporation into the PS surface at strongly photoluminescent regions; and Raman scattering, which demonstrates that the PL is correlated with the creation of amorphous structural regions. All of these testing methods indicate the manner in which the chloride salt stabilizes the PS substrate.

Another exemplary embodiment of the present invention includes treating PS substrates with a dye (e.g., 3,3'-diethyloxadicarbocyanine iodide (DODCI) and Rhodamine 700). In general, the dye should have negligible absorption at the wavelengths of maximum absorption for the PS substrate. After a period of aging in darkness these dye-treated PS substrates can be pumped at about 337.1 nanometers (nm) (nitrogen laser) near the maximum in the PS absorption spectrum (far from the major absorption regions of the impregnating dye). Time-dependent PL histograms indicate that the resulting PL emission rate is enhanced. The enhancement in the PL emission rate may be attributed to an interaction between the surface-bound fluorophors, which characterize PS substrates and the dye. This interaction results in the creation of a distribution of PS-dye complexes, which enhance the nominal PL emission rate from the untreated PS surface. In a preferred embodiment, the DODCI treated samples display PL that exceeds that of nominally prepared PS by a factor of five or more.

A further exemplary embodiment of the present invention includes the metallization of a PS substrate. One of the existing challenges in fabricating PS devices rests with establishing electrical contact to the PS substrate. In an exemplary embodiment, PS substrates are capable of being metallized in a controlled manner using electroless metal-coating solutions and inducing the metal to plate onto the PS substrate. An examplary embodiment includes using an electroless metal solution, which can be introduced to the PS substrate after treating the PS substrate with a hydrazine solution so that subsequently the metal can be deposited onto the PS substrate in a controlled manner. The metal-containing solution includes, but is not limited to, any one, or all, or combination of copper, silver, gold, nickel, palladium, platinum, other metals that are commonly deposited using electroless techniques. This method is capable of using the "long-lived" PS substrate PL to enhance reduction at the PS substrates surface. This may be accomplished by creating excited fluorophors on the PS surface to enhance interaction and reduction at the PS substrate surface. Using this method enables metals to readily deposit onto the PS substrate within PS micropores and nanopores. Further, under controlled conditions the metallization only occurs where the PS surface is illuminated with light from a light source. (e.g. Xenon (Xe) arc lamp, Helium-Neon (HeNe) laser, or other appropriate light source). Furthermore, the thickness of the metallization deposit is proportional to the time and intensity of exposure of the PS surface to the light source.

In conventional electroless metal plating, the surface is usually first coated with palladium (Pd) metal to catalyze the deposition process. For purposes of this disclosure, the addition of a catalyst to the metal plating process is considered to be operating under catalytic conditions. However, embodiments of the present invention do not require an additional catalyst, which, for purposes of this disclosure, means that the method is performed under "non-catalytic conditions." Indeed, in the method of the present invention, The illuminated PS surface itself is catalyzing the deposition. Further, localized heating is not promoting the deposition; rather the metal deposition occurs when the PS substrate is illuminated at wavelengths less than about 750 nm, consistent with its bandgap.

A further exemplary embodiment of the present invention includes the metallization of a PS substrate to produce a low electrical resistance metallized PS substrate that has a resistance from about 20 ohms to about 1000 ohms. Another embodiment includes metallized PS substrates with resistances between about 20 ohms and about 100 ohms. Still a further embodiment includes metallizated PS substrates with resistances between about 20 ohms and about 60 ohms.

A. $HCl(H_2O)$ Alcohol Enhancement of Porous Silicon Substrates

As discussed above, an exemplary embodiment of the present invention includes a method and system of treating PS substrates with an $HCl/(H_2O)$ solution to enhance and stabilize the PL of the PS substrates. PS substrates treated in an $HCl/(H_2O)$ solution display a strongly enhanced in sitU PL. PS substrates treated in an $HCl/(H_2O)$ alcohol solution (e.g. at least 0.2 M) display enhanced in situ and ex situ PL and can maintain enhancement for time periods on the order of years. Another exemplary embodiment includes treating the porous silicon substrates with an $HCl/(H_2O)$ solution (e.g. at least 0.2 M) then subsequently treating the PS substrates with an alcohol. This embodiment also enhances and stabilizes the in situ and ex situ PL of the PS substrate.

More specifically, the post-etch method of enhancing and stabilizing the PL of a PS substrate includes treating the PS substrate with an $HCl/(H_2O)$ solution. The PS substrate includes, but is not limited to a microporous framework upon which is superimposed a nanoporous layer. The $HCl/(H_2O)$ solution is at least 0.2 M. In one exemplary embodiment, the $HCl/(H_2O)$ solution includes an alcohol. Alcohols that can be used include, but are not limited to, ethanol, methanol, other appropriate alcohols for treating PS substrates, and combinations thereof. In another exemplary embodiment, the PS substrate is treated with the $HCl/(H_2O)$ solution, then subsequently treated with an alcohol (e.g., ethanol, methanol, etc.) This method of treatment enhances the in situ and ex situ PL.

Chloride-ion stabilization appears independent of the method of preparing the PS substrates, implying that the chloride salt treatment largely stabilizes the surface constituency of the photoluminescent PS substrate. This can be demonstrated by scanning electron micrographs, which show the change that accompanies the HCl treatment of the PS substrate surface. Further, energy dispersive spectroscopy reveals chloride incorporation into the PS surface at strongly PL regions. Furthermore, Raman scattering demonstrates that the PS substrate PL enhancement is correlated with the creation of amorphous structural regions. In conjunction with detailed quantum-chemical modeling, time-dependent histograms obtained for the HCl-treated systems indicate that the resulting PL, initiated through the pumping of the HCl-modified surface, displays the manifestation of a significant surface interaction. This interaction might result in the formation of both chlorosilanones and chlorsilylenes. In addition, the hydrogen cation ($H^+$) may play a role in the stabilization of the silanol-based features of the PS substrate surface both as a contribution to the flourophor formation and by decreasing the hydroxyl ($OH^-$) concentration in solution.

EXAMPLE 1

The following is a non-limiting illustrative example of an embodiment of the present invention that is described in more detail in Gole, et al., Phys. Rev. B. 61, 5615 (2000); Gole, et al., J. Phys. Chem. 101, 8864 (1997); Gole, et al. Phys. Rev. B. 62, 1878 (2000), which all are herein incorporated by reference. This example is not intended to limit the scope of any embodiment of the present invention, but rather is intended to provide specific experimental conditions and results. Therefore, one skilled in the art would understand that many experimental conditions can be modified, but it is intended that these modifications are within the scope of the various embodiments of this invention.

Single crystal <100> boron doped silicon wafers with resistivities of about 50–100 ohm cm were used in the current study. Both highly branched nanoporous and hybrid nanoporous covered microporous PS substrate samples were fabricated in an electrochemical cell constructed from high-density polyethylene. The working electrode was attached to the back of a p-type silicon wafer <100> (aluminum (Al) coated) and the counter electrode corresponded to a platinum (Pt) foil placed in solution. The cell was sealed to the front of the wafer, using a clamp, as about a 1 centimeter squared ($cm^2$) section of the wafer made contact with the solution. A magnetic stir-bar was used to prevent the build-up of hydrogen at the surface of the silicon. The electrochemical etching current was supplied by an Potentiostat/Galvanostat. The nanoporous samples were etched in an aqueous 25% hydrofluoric acid (HF) in methanol solution while the hybrid samples were etched in a solution of 1 M $H_2O$, 1M HF, and 0.1M tetrabutylammonium percholate (TBAP), all in acetonitrile. The aqueous etched samples were etched at a current density ranging from about 5 to 6 miliamp per square centimeter squared ($mA/cm^2$) for about 50 to 75 minutes while the hybrid samples were etched with a current density of about 6 $mA/cm^2$ for between 50 and 75 min. Using this latter procedure, pores approximately 1 to 2 $\mu$m wide by about 10 $\mu$m deep were formed, and well covered by a coating of nanoporous silicon.

Single-crystal <100>, boron-doped silicon wafers (substrate) of resistivity ranging from about 1 to about 50 ohm cm were also etched in an aqueous HF solution. For several of the experiments (about 20% concentration of HF in methanol), a 300-nm thin film of aluminum was sputtered onto the backside of the wafers. Electrical connections were made to the wafers by connecting a wire to the thin film of aluminum using conductive paint. The wire and aluminum film were then covered with a layer of black wax, leaving only the front surface of the silicon exposed to the etching solution. Both the wired silicon-wafer as one electrode and a platinum wire as a counter-electrode may be connected through a Teflon™ cap, which was tightly fitted to a cuvette containing the etch solution. Ohmic contacts were made to the wafer by connecting a wire to the thin film of aluminum using conductive paint. Etching currents ranged from about 2 to 30 $mA/cm^2$, but the samples considered here were usually etched at 8 $mA/cm^2$ for 10 minutes.

These aqueous HF-etching procedures are capable of leading to the formation of a "nanoporous" surface on the silicon wafer. However, in order to obtain a thicker nanoporous coating and increase the sampling volume, Si<100> samples were treated in a 25% HF in methanol solution at a current density of about 14$mA/cm^2$ for a period of about 30 min. In all cases, the prepared aqueous samples were either treated directly in solution or washed in spectral quality methanol and dried in air. They were then subsequently transferred to a crucible containing either methanol or the postetch chloride solution of interest.

Samples prepared in about 20% HF/MeOH aqueous etching solution, once rinsed in a combination of doubly deionized water and methanol or ethanol and allowed to dry, yield a significant ex situ photoluminescence. If a cleaned sample is immediately placed in double deionized water, a gradual rise in the in situ PL intensity at 620 nm can be observed. Similarly, if such a cleaned sample is placed in an ultra high purity low molecular weight alcohol (e.g. methanol and ethanol) solution, the in situ PL will slowly increase and gradually diminish on the time scale of several hours. However, it is to be noted that this behavior is in sharp contrast to the effect of the alcohols in combination with HF: this combination rapidly quenches the PL within several minutes.

The post-etch treatment of the PS substrates with an aqueous HCl solution and the enhancement and stabilization is now discussed. A PS sample prepared by aqueous etch is first etched in a methanol/20% HF [6 mol./1 HF in MeOH (aq)] solution for 10 min., washed with methanol, dried in air, and then placed first in a solution of doubly deionized water and then dilute 6M HCl. The intensity of the PL, excited by a nitrogen (N) laser, increases somewhat upon removal from the HF etch solution and again increases gradually as the sample is placed in water. However, upon adding HCl the orange-red PL intensity increases significantly and remains constant over the time period (up to about 3.5 h) in which the sample is present in the HCl solution. Within the time frame of these processes, the wavelength-dependent spectral profile of the PL emission spectrum appears to have been altered only slightly from the time it was removed from the HF etching solution and dried in air through the period in which the sample remained in the HCl solution. The introduction of a high concentration of HCl has stabilized the PS photoluminescence.

In contrast to the stabilizing effect that 6M hydrochloric acid has on the PS substrates surface, a 2.75M hydrogen iodide (HI) solution almost completely quenches the PL. The effect of a 4.5M hydrogen bromide (HBr) solution is intermediate. The effect of the HI solution can be attributed to the strong quenching of surface-bound flurophors resulting from the formation of $I_2$ and $I_3$ in an oxidizing acidic environment. A similar effect also occurs with bromine, albeit to a much lesser extent.

Post-etch treatment of the PS substrate in a methanol-NaCl solution is now discussed. The pronounced stabilization of the PS substrate photoluminescence in the 6M HCl solution focuses on the effect that the chloride ion may have on the PL process. The introduction of an aqueous etched (20% HF/MeOH) PS substrate sample into a saturated NaCl/MeOH solution produces a clear saturating PL emission signal. This is manifest in two ways. In the absence of sodium chloride (NaCl), the 620-nm PL from PS substrate placed in methanol solution slowly rises, eventually peaks, and then more gradually decreases in intensity. If NaCl is placed into this solution before the PL has reached its maximum intensity in methanol, the PL will slowly increase to a maximum then plateau. For the introduction of the PS substrate sample into a NaCl-saturated solution in methanol, this plateau is reached over a time scale of several hours (compared to about 30 min for a 6M HCl solution). Furthermore, the photon-count level at the maximum PL intensity appears to be considerably muted relative to the observed maximum for a PS substrate sample in methanol alone. In contrast, if the saturated NaCl solution is introduced to the methanol solution after the PL photon-count level has peaked in the methanol solution, the PL is found to plateau at an intensity corresponding closely to that at the time of the NaCl introduction.

Post-etch treatment of PS substrate samples in tetrabutylammonium chloride ($Cl^-$) solution is now discussed. The results observed when placing a prepared PS substrate sample in 6M HCl and saturated NaCl solutions certainly call attention to the potential role of the chloride ion in stabilizing the PS substrate photoluminescence. In order to study the effect of varying chloride-ion concentrations on the PS substrate luminescence, both tetrabutylammonium perchlorate (TBAP) and HCl solutions are studied.

The PS substrates PL at 620 nm is monitored after a sample, etched in a 20% HF/MeOH solution, is washed in methanol, dried in air, and then placed in a tetrabutylammonium chloride (TBAC) in methanol solution. The TBAC concentrations used include 0.1M, 0.2M, 0.3M, 0.4M and 1.0M. These experiments can be used to compare directly to the NaCl/MeOH saturated solution results. The 0.1M TBAC solution leads to a PL intensity which peaks at about 4300 counts, seventy five minutes into the bath cycle, and then it monotonically decreases to about 1000 counts within 5 hours. The source of the PS luminescence is temporarily enhanced, but it is not being stabilized at longer time scales. When the chloride concentration is raised to 0.2M, the photon-count level increases moderately as the PL intensity peaks at about 4800 counts, now 150 min. into the bath cycle. The signal again monotonically decreases to about 1000 counts within 5 hours. This trend continues for the 0.3M solution as the PL intensity peaks at about 6500 counts, 240 min into the run; however, despite a significant peak photon count, an eventual drop-off the PL signal is observed. The 0.4M chloride-ion solution again demonstrates an increased photon-count level (peak about 12000 counts). There is also a notable decrease in the rate of PL decay. This trend appears to reverse for the 1M concentrated $Cl^-$ solution. Although the PS luminescence peaks on a shorter time scale, the PL peak level has dropped to about 6000 counts and also decays at a much more rapid rate, clearly paralleling that for the 0.1M and 0.2M solutions. Thus, for the tetrabutylammonium counterion (TBA$^+$), evidence is produced for a peak effective chloride-ion concentration but no evidence is produced for an extended stabilization of the PL signal with time.

In situ stabilization in HCl solutions of varying concentrations is now discussed. The results obtained in saturated NaCl and TBAC solutions emphasize the remarkable PL stabilization that is inherent to a PS sample bathed by a 6M HCl solution. Next, a comparison of various concentrations of HCl is conducted. The concentrations include 0.1M, 0.2M, 0.3M, 1M, 2M, and 3M. For a 3M HCl solution in either water or methanol, the photon count rate is comparable to that for the 6M HCl solution. The count rate is still rising after 6.5 h in dilute HCl, whereas it levels off at about 20000 counts in the 6M HCl/($H_2O$) MeOH solution after approximately 2 h. Both bath solutions demonstrate a profound stabilizing and enhancing effect on the PS emission intensity.

As the HCl molarity decreases, there are clear subtle changes in the in situ PL. For the 2M and 1M dilute HCl/($H_2O$) solutions, the count rate is again comparable to that for the higher molarities and still rising after 6 h; however, the count rate in the 2M HCl/MeOH solution has already dropped to about 14000 (although appearing reasonably stabilized) and shows an even sharper decline for the 1M solution where a maximum intensity of about 5000 counts occurs about 2 h into the time scan and a precipitous decrease to barely 3000 counts is observed at 6 h.

The HCl-water system displays a remarkable in situ enhancement and stabilization. With further dilution to 0.3M, one finds a comparable but possibly a slightly increased enhancement of the PL intensity is observed, which is still rising to about 25,000 counts after 6 h of PS substrate sample exposure to the HCl solution. At 0.2M, the HCl solution again displays a comparable stabilization that appears to plateau at about 22000 counts. However, at 0.1M, the HCl solution induces a much smaller enhancement of the PL signal from a sample photoluminescing in doubly deionized water. Furthermore, the stabilization of the signal is marginal as shown by a peaking at about 2625 counts approximately 4 h into the run. The threshold for stabilization and enhancement thus appears quite dramatic.

The results shown for HCl suggest the importance of the $H^+$ counterion generated from the strong acid HCl as well as the chloride ion. The $H^-$-ion concentration may play a role in stabilizing silanol-based features on the PS substrate surface both as a contributor to flurophor formation and by decreasing the [$OH^-$] concentration in solution. This is supported because the introduction of NaOH into this bath solution completely quenches the PL as it significantly increases the hydroxyl-ion concentration.

Ex situ PL from HCl-treated PS substrates is now discussed. The samples that have been treated in HCl($H_2O$)/MeOH and HCl/$H_2O$ solutions exhibit distinctly different ex situ behavior. The following demonstrates the different behavior. The growth of the in situ PL emission in a 3M HCl ($H_2O$)/MeOH solution peaks at about 12500 counts. Upon removal from the HCl($H_2O$)/MeOH bath, the ex situ PL emission intensity continues to maintain itself for periods exceeding several months. A similar treatment of the PS substrate surface in 3M HCl($H_2O$)/MeOH also produces a highly photoluminescent ex situ sample with a considerably higher long-term photoluminescent emission intensity peaking at about 18000–20000 counts (about 620 nm). In sharp contrast, if a PS substrate sample treated in an HCl/$H_2O$ solution and characterized by a PL emission intensity close to 20000 counts is removed from the solution and dried in air, the PL emission intensity drops to about 4000 counts at 620 nm within 24 h even decreasing precipitously during the laser pumping and PL measurement period to about 3000 counts. Another comparison shows long-term PL stability, for a 1M HCl/$H_2O$-tested sample that is immediately placed in ultra high purity methanol. The PL scans display not only a long-term stability but also a peak intensity considerably redshifted (~500 Å). The ex situ PL signal from an HCl/$H_2O$ solution-treated sample is almost completely extinguished within only a few days. However, if the PS substrate sample is rinsed in ultra high purity methanol after an in situ HCl/$H_2O$ treatment and allowed to remain in a methanol solution for two to three days, the PL intensity can significantly be maintained, ex situ, indefinitely.

B. Metallization of PS Substrates

An existing challenge in fabricating PS devices rests with establishing electrical contact to the PS substrates. An exemplary embodiment of the present invention uses the methods of enhancement and stabilization of the PS substrates and the excited state fluorophors that can be created on the PS surface to enhance reduction (metallization) at the PS substrate surface. Embodiments of the present invention include using the excited state fluorophors, whose interaction and reducing capabilities are greatly enhanced relative to that of their ground states, to induce the deposition of the metal from a metal-containing solution onto the surface of the PS substrates. Metal ions can be reduced and deposited on the PS substrates and within the pores of the PS substrates. The deposition occurs in regions of the PS substrates that are illuminated with light from a light source (e.g. Xenon arc lamp, HeNe laser etc.). The illumination produces PL from the PS substrates which in turn causes metallization of the PS substrates. The thickness of the deposit upon the PS substrates is proportional to the time and intensity of exposure to the light source. While conventional electroless metal plating generally requires surface coating with Pd metal to catalyze the deposition process, exemplary embodiments of the present invention require no catalyst to deposit the metals of interest as the illuminated PS surface is itself catalyzing the deposition. These embodiments are therefore under non-catalytic conditions since no additional catalyst is needed to metallize the PS substrates.

More specifically, the post-etch method of eletroless metallization of PS substrates includes treating the PS substrates with an $HCl(H_2O)$ solution. The PS substrates has a microporous framework on which is superimposed a nanoporous layer. The $HCl(H_2O)$ solution is at least 0.2M. In an exemplary embodiment, the $HCl(H_2O)$ solution includes an alcohol. The alcohols that may be used include, but are not limited to, ethanol, methanol, other appropriate alcohols for treating PS substrates, and any combination thereof. In another exemplary embodiment, the PS substrate is treated with an $HCl(H_2O)$ and alcohol solution. The next step, for both of the previous embodiments, includes treating the PS substrate with a hydrazine solution, which can remove fluorides from the porous silicon substrate. Thereafter, the PS substrate is introduced to a metal-containing solution. The metal-containing solution includes, but is not limited to, copper, silver, nickel, gold, platinum, palladium, other appropriate electroless metals, and combinations thereof. Thereafter, the PS substrate is illuminated with a light source of less than a wavelength of 750 nanometers. The light source includes, but is not limited to, a Xenon arc lamp, HeNe laser, or any other appropriate light source producing light of wavelength less than 750 nanometers for the metallization process. The illumination of the PS substrates causes the metal of the metal-containing solution to be reduced upon the surface and in the micropores and nanopores of the PS substrates. The PS substrate can also include a pattern or mask such that only portions of the PS substrate surface is metallized. The metallized PS substrate fabricated is capable of having resistances in the range of 20–1000 ohms. In addition, the metallized PS substrate can have a resistance in the range of 20–500 ohms. A preferred embodiment includes a metallized PS substrate that has a resistance in the range of 20–60 ohms.

EXAMPLE 2

The following is a non-limiting illustrative example of an embodiment of the present invention which is discussed in more detail in Gole, et al., J. Electro. Soc., 147, 3785 (2000), which is herein incorporated by reference. This example is not intended to limit the scope of any embodiment of the present invention, but rather is intended to provide specific experimental conditions and results. Therefore, one skilled in the art would understand that many experimental conditions can be modified, but it is intended that these modifications are within the scope of the embodiments of this invention.

As discussed for example 1, single crystal <100> boron doped silicon wafers with resistivities of about 50–100 ohm-cm were used in the current study. Both highly branched nanoporous and hybrid nanoporous covered microporous PS substrate samples were fabricated in an electrochemical cell constructed from high-density polyethylene. The working electrode was attached to the back of a p-type silicon wafer <100> (aluminum coated) and the counter electrode corresponded to a platinum foil placed in solution. The cell was sealed to the front of the wafer, using a clamp, as about a 1 $cm^2$ section of the wafer made contact with the solution. A magnetic stir-bar was used to prevent the build-up of hydrogen at the surface of the silicon. The electrochemical etching current was supplied by an Potentiostat/Galvanostat. The nanoporous samples were etched in an aqueous 25% HF in methanol solution while the hybrid samples were etched in a solution of 1 M $H_2O$, 1 M HF, and 0.1M tetrabutylammonium percholate (TBAP), all in acetonitrile. The aqueous etched samples were etched at a current density ranging from about 5 to 6 $mA/cm^2$ for about 50 to 75 minutes while the hybrid samples were etched with a current density of about 6 $mA/cm^2$ for between 50 and 75 min. Using this latter procedure, pores approximately 1 to 2 $\mu m$ wide by about 10 $\mu m$ deep were formed, and well covered by a coating of nanoporous silicon.

Further, as discussed in example 1, single-crystal <100>, boron-doped silicon wafers (substrate) of resistivity ranging from about 1 to about 50 ohm cm were also etched in an aqueous HF solution. For several of the experiments (about 20% concentration of HF in methanol), a 300-nm thin film of aluminum was sputtered onto the backside of the wafers. Electrical connections were made to the wafers by connecting a wire to the thin film of aluminum using conductive paint. The wire and aluminum film were then covered with a layer of black wax, leaving only the front surface of the silicon exposed to the etching solution. Both the wired silicon-wafer as one electrode and a platinum wire as a counter-electrode could be connected through a Teflon cap, which was tightly fitted to a cuvette containing the etch solution. Ohmic contacts were made to the wafer by connecting a wire to the thin film of aluminum using conductive paint. Etching currents ranged from about 2 to 30 $mA/cm^2$, but the samples considered here were usually etched at 8 $mA/cm^2$ for 10 minutes.

After the aqueous and hybrid etches were complete, the samples were removed to air, washed with methanol, and dried. For the majority of the samples, the etched PS substrate samples were treated with anhydrous concentrated hydrazine (about 30 M) to remove fluorine from the surface via a reaction which converts the fluorine and hydrazine to nitrogen and HF. Several of the samples were later treated with a 6M HCl/MeOH solution to: (1) enhance the photoluminescence and (2) stabilize the photoluminescence quantum yield.

An electroless copper solution was prepared, following standard procedures known in the art, from $CuSO_4 \cdot 5H_2O$ (0.76 g), sodium potassium tartrate (4.92 g), formaldehyde (2 ml), and NaOH (0.80 g) diluted to 200 ml in doubly de-ionized water. A slightly modified procedure was used to prepare an electroless silver solution. First 0.75 M/L $NH_4NO_3$ (12 g/200 ml) and 2 M/L $NH_3$ (24.3 mL $NH_4OH$/ZOOml $H_2O$) solutions were mixed together and diluted in a 100 mL volumetric flask with doubly ionized water. To this solution was added 0.09 M/L $AgNO_3$ (1.36 g $AgNO_3$/200 ml) followed by 0.1 M/L Co $(NO_3)_2 \cdot 6H_2O$ (5.82 g diluted into 50 ml of doubly de-ionized water). To this mixture was added sufficient doubly de-ionized water to bring the total solution volume to 200 ml. The copper and silver solutions were maintained in a refrigerator at 20° C. until they were used. As discussed above, other metal-containing solutions can be produced and used.

Both the nanoporous and hybrid macroporous-nanoporous PS samples were exposed to the copper and silver electroless solutions either directly or after the samples were treated with HCl. The majority of the samples were also treated with anhydrous hydrazine. Samples were exposed directly to the electroless solutions both under ultraviolet/visible (uv) and HeNe laser PLE, in complete darkness, or in the presence of laboratory room lights. The observation of the reduction of the electroless solution metallic ions and the subsequent metal deposition was found to be illumination dependent.

The nature of the contact to the PS surface formed from <100> p-type silicon is now discussed. To place electroless metal contacts on the PS surface, this surface was first passivated with a non-stoichiometric silicon nitride, $SiN_x$, layer which was grown by plasma enhanced chemical vapor deposition, PECVD. The openings in the $SiN_x$ layer needed for formation of the porous layer were made by reactive ion etching, RIE. After an anodic etch, the porous layer was prepared and electroless copper (Cu) was deposited on the surface of this PS substrate layer to form the metal contacts necessary to make a resistance measurement.

Data was obtained for PS substrate samples exposed to electroless silver (Ag) and copper solutions at about 16 and 30° C. For the vast majority of these experiments the samples were bathed in anhydrous hydrazine for periods of 30, 60, or 90 minutes before exposure in the electroless solutions. This treatment was carried out to remove fluorine based constituents from the PS substrate surface. With the removal of fluorine, the effects of optical pumping as it produces the long-lived photoluminescent emitter, can be readily evaluated. PS substrate samples, which are photoluminescent, are capable of plating silver and copper from an electroless solution, in which they are in contact, if exposed to uv/visible light or when exposed to a HeNe laser. If the PS surface is not photoluminescent or the PL from a photoluminescent surface is quenched, the deposition of copper or silver is diminished or completely absent. While temperature is an important consideration in these experiments, measurements of the very small surface temperature change as a function of exposure to the light sources used in this study demonstrate that the metal plating is not the result of a surface heating effect. However, an increased ambient temperature for the PS substrate surface, especially for those experiments involving electroless silver plating, can lead to an enhancement of the deposition process. In other words, the plating is more pronounced and more difficult to control precisely at 30° C. than at 16° C.

Photoluminescent PS substrate samples were clamped to the surface of a hollow copper block whose temperature could be adjusted by flowing water through a slush bath configuration at room or ice temperatures. Simultaneously, the sample under study was placed under a ring used to hold the electroless solution as the entire experiment was carried out under a flowing stream of high purity argon. Over the course of an experiment, the surface temperature was measured with a thermocouple. While this system could be operated at temperatures considerably lower than the ice bath temperature, $T_{surface}$ (measured)=16±1° C., it was found that: (1) this was unnecessary to control the electroless process; and (2) that colder device temperatures eventually led to the undesirable condensation of the electroless solution. The temperature rise associated or induced by the high intensity uv/visible lamp, never exceeded 1.5° C. No temperature rise was recorded for those experiments with the HeNe laser (even if the laser was focused onto the tip of the thermocouple).

The reduction of silver from the electroless solution was found to be considerably more efficient than was that of copper from its electroless solution. For the silver samples at 16° C., hydrazine exposure was systematically varied from 30 to 60 to 90 seconds demonstrating only a moderate effect with increased exposure on the observed plating. Samples treated with hydrazine plate at a much slower rate than do untreated samples which have maintained a fluoride constituency on the PS substrate surface. Results were obtained for both aqueous etched and hybrid etched samples, the latter interacting with the electroless solutions notably more effectively.

SEM micrographs of copper and silver deposition into the pores of a hybrid macroporous nanoporous sample at 16° C. demonstrate the deposition of metal to the walls of the micropores. The results of the resistance measurements on the electroless copper connections indicate resistances ranging from about 20 ohms to about 1000 ohms.

The electroless copper solution used in these experiments is considerably more stable (kinetically) than the electroless silver solution. In contrast to a freshly formed PS substrate surface, there is no plating on a c-Si substrate from the electroless copper solution and likewise there is no plating on PS substrate samples which have been oxidized in air for periods exceeding several weeks. As a freshly formed photoluminescent sample readily plates copper at room temperature, the plating ability of a PS substrate sample which has been subjected to extended oxidation can be restored with a brief exposure to a HCl solution. Samples which are exposed to the electroless copper bath will generally not plate copper if they: (1) are placed in a darkened location; (2) are soaked in etching solution in the absence of current flow before exposure; (3) are a heated at their surface in the presence of the electroless bath; or (4) have undergone a previous PL quenching process do not plate copper.

Thus, the plating process appears to require, at least in part, that a treated PS substrate surface be photoluminescent. However, it is known in the art that copper can be reductively deposited, in small concentration, on a PS substrate surface from an aqueous $Cu^{+2}$ solution in the absence of photoexcitation. Thus, anhydrous hydrazine has been introduced to modify the initially prepared PS substrate as a means of removing the fluoride centers on the surface, which may act as reducing centers for $Cu^{+2}$ (aq) ions. Upon treatment with hydrazine the copper reduction at the PS substrate surface (1) is slowed to an extent which allows a significant improvement in the degree of control of the metallization process, (2) clearly becomes a function of surface excited state fluorophors, and (3) is notably more amenable to pattern formation. The exposure of an untreated PS substrate surface, with its surface fluoride constituency, to the HeNe laser produces a photodefineable pattern in 5 minutes whereas the pattern produced with a Xe ArC lamp, with a plating time approaching one minute, is not photodefineable. Surface fluoride, like palladium, appears to act as a catalyst for the reduction process.

The PS substrates, whose luminescence has been quenched, cannot be patterned by the present method. While the mechanism of electroless deposition onto PS might result in part from electron-hole pair generation within the PS substrates it more likely results from excited state electron transfer involving surface-confined silicon oxyhydrides.

C. Dye Enhanced PL of PS Substrates

Room temperature PL of PS substrates has attracted considerable attention primarily because of its potential use in the development of silicon based optoelectronics, displays, and sensors. However, the relatively long excited state lifetime associated with this PL, which appears to be of the order of tens to hundreds of microseconds, is problematic for some of these applications. The efficiency and wavelength range of the emitted light can be affected by the physical and electronic structure of the surface, the nature of the etching solution, and the nature of the environment into which the etched sample is placed.

These outlined results suggest the possibility that several common fluorescent dyes, whose radiative lifetimes are of the order of nanoseconds, might be made to interact with the PS substrate surface so as to considerably improve the observed PL rate. Strong physisorption or chemisorption of certain of these fluorescent dyes with the fluorescent emitter on the PS substrate surface through complexation enhance the quantum yield and modify the lifetime of the fluorescent events associated with the PS substrate.

More specifically, the post-etch enhancement of the PL from a PS substrate, which has a microporous framework on which is superimposed a nanoporous layer, includes treating the PS substrate with a dye. The dyes that can be used include, but are not limited to, 3,3-diethyloxadicarbacyamine iodide, Rhodamine dye compounds (e.g. Rhodamine 6G, Rhodamine 700), Fluorocein, dicyanomethylene (DCM) dye compounds (e.g. 4-dicyanomethylene-2-methyl-6-(p-dioctylaminostyryl)-4H-pyran, 4-dicyanomethylene-2-methyl-6-(p-dimethylaminostyryl)-4H-pyran, 4-dicyanomethylene-2-methyl-6-[2-(1-methyl-1,2,3,4-tetrahydroquinolin-6-yl)ethenyl]-4H-pyran), 4-dicyanomethylene-2-methyl-6-[2-(2.3,6,7-tetrahydro-1H, 5H-benzo[ij]quinolizin-8-yl)etheny]-4H-pyran), and other dyes that have negligible absorption at the wavelengths of maximum absorption for the PS substrate.

EXAMPLE 3

The following is a non-limiting illustrative example of an embodiment of the present invention and is described in more detail in Gole, et al., J. Phys, Chem. B, 103, 979 (1999), which is incorporated herein by reference. This example is not intended to limit the scope of any embodiment of the present invention, but rather is intended to provide specific experimental conditions and results. Therefore, one skilled in the art would understand that many experimental conditions can be modified, but it is intended that these modifications are within the scope of the embodiments of this invention.

As discussed for example 1 and 2, single crystal <100> boron doped silicon wafers with resistivities of about 50–100 ohm-cm were used in the current study. Both highly branched nanoporous and hybrid nanoporous covered microporous PS substrate samples were fabricated in an electrochemical cell constructed from high-density polyethylene. The working electrode was attached to the back of a p-type silicon wafer <100> (aluminum coated) and the counter electrode corresponded to a platinum foil placed in solution. The cell was sealed to the front of the wafer, using a clamp, as about a 1 cm$^2$ section of the wafer made contact with the solution. A magnetic stir-bar was used to prevent the build-up of hydrogen at the surface of the silicon. The electrochemical etching current was supplied by an Potentiostat/Galvanostat. The nanoporous samples were etched in an aqueous 25% HF in methanol solution while the hybrid samples were etched in a solution of 1 M $H_2O$, 1M HF, and 0.1M tetrabutylammonium percholate (TBAP), all in acetonitrile. The aqueous etched samples were etched at a current density ranging from about 5 to 6 mA/cm$^2$ for about 50 to 75 minutes while the hybrid samples were etched with a current density of about 6 mA/cm$^2$ for between 50 and 75 min. Using this latter procedure, pores approximately 1 to 2 $\mu$m wide by about 10 $\mu$m deep were formed, and well covered by a coating of nanoporous silicon.

Further, as discussed in example 1, single-crystal <100>, boron-doped silicon wafers (substrate) of resistivity ranging from about 1 to about 50 ohm cm were also etched in an aqueous HF solution. For several of the experiments (about 20% concentration of HF in methanol), a 300-nm thin film of aluminum was sputtered onto the backside of the wafers. Electrical connections were made to the wafers by connecting a wire to the thin film of aluminum using conductive paint. The wire and aluminum film were then covered with a layer of black wax, leaving only the front surface of the silicon exposed to the etching solution. Both the wired silicon-wafer as one electrode and a platinum wire as a counter-electrode could be connected through a Teflon cap, which was tightly fitted to a cuvette containing the etch solution. Ohmic contacts were made to the wafer by connecting a wire to the thin film of aluminum using conductive paint. Etching currents ranged from about 2 to 30 mA/cm$^2$, but the samples considered here were usually etched at 8 mA/cm$^2$ for 10 minutes.

Prepared aqueous and hybrid samples were removed from the etching solution, washed in reagent grade methanol and treated with $10^{-3}$ molar (in doubly distilled $H_2O$) 3,3'-diethyloxadicarbocyanine iodide (DODCI) or Rhodamine 700. The PS substrate samples were dipped for several seconds or soaked for periods extending to about 45 minutes.

Pore structure and PL emission from PS substrates for untreated PS substrate samples is now discussed. The PL emission from aqueous and hybrid etched samples observed over the period 1.5–100 $\mu$s after excitation (PLE) at 337.1 nm (t=0) suggests that the PL observed for the hybrid etched sample exceeds that for the aqueous etched sample and demonstrates a slight 10–15 nm red shift.

PS substrates are known in the art to display a "green" PL resulting from an intermediate precursor state in the earlier stages of its formation, especially in an aqueous etch solution. The temporal decay and spectral profile of the "green" PL and transformation to a final "orange-red" PL emission during and following PS formation suggest the coupling of these PL emitters to the PS surface. The manifestations of the green and orange-red emission features in spectra are virtually identical for the aqueous and hybrid etched samples. Observed spectrum histograms represent the first clear observation of the "green" luminescence feature in an air-aged sample and demonstrate the magnitude of its contribution to the overall spectrum. With time (1) the "green" and "orange-red" emission features merge into each other as the source of the green emitter undergoes oxidative transformation to the final "orange-red" emitter, and (2) the longer wavelength features contributing initially to the orange-red emission are seen to decay most rapidly leading to what appears to be the manifestation of a blue shift in this feature in the absence of etching.

After 5.5 $\mu$s, for the aqueous etched sample, and 9.5 $\mu$s for the hybrid etched sample, the observed spectral features change little with delay time and the emission signal over the gate width of the scan begins to decrease. The dominant characteristics of the 1.5–100 is spectra develop over the time span of the histograms, and with longer time delays, the monitored emission, while maintaining an identical wavelength dependence, decreases precipitously in intensity. The data demonstrate a nearly parallel although slightly different development of the PL intensity for the aqueous and hybrid etches and an overall spectral distribution which is quite similar for these etched samples.

Dye-treated PS substrates are now discussed. Common dyes, such as DODCI and Rhodamine 700, have been used because of their negligible absorbance in the 350±20 nm range, the approximate peak absorption range of the PS excitation spectrum. The absorption spectrum for DODCI demonstrates a minimal absorbance for λ=330–470 nm. Rhodamine 700 is also a reasonable candidate although this dye does display a small absorbence at λ<330 nm.

Here, the focus is to create an environment for the energy transfer pumping of the adsorbed dye and/or the mediation of the longer-lived fluorescence from the PS substrate due to PS-dye complexation. As the optical pumping of the PS substrate surface is known to access a long-lived excited state triplet exciton, this excited state can be an energy reservoir for subsequent energy (or electron) transfer between the PS substrate surface and the adsorbed dye. Such transfer might take place through the pumping of a dye molecule in close proximity to the PS substrate surface via a fast intermolecular electron transfer. Alternatively, the dye chemisorbed with the surface-active exciton could receive the exciton energy via fast intramolecular energy transfer along a short bonding chain. Finally, the presence of this much more efficient radiator could enhance the PS substrate emission rate simply through complexation with the PS fluorophors.

Samples exposed to DODCI or Rhodamine 700 dye, when pumped at 337.1 nm by a nitrogen laser, display an initial quenching of the PS substrate PL followed by an expected slow and continued increase in the PL emission rate upon aging in the dark, in air, for an extended period. The aging cycle eventually produces a PL signal which has been maximized and maintained for a period of several months.

After some period of aging, the DODCI treated sample is found to display a photoluminescence corrected for phototube and system response which exceeds the intensity of a nominally prepared PS substrate sample by a factor of five. Further, the distribution of fluorescence is notably broader with a peak response considerably red shifted (about 30–50 nm) from an aqueous etched untreated PS substrate sample. This is consistent with a PS-dye coupling. Note that, as opposed to high temperature annealing at temperatures between 100° C. and a very significant 600° C. for short periods to promote oxidation on the PS substrate surface, this embodiment shows a long-term aging process under conditions which promote the conversion of the surface and ensure a dye initiated modification without seriously modifying the interacting constituencies.

Simple immersion or prolonged soaking of the PS substrates in millimolar (mM) dye solutions is sufficient not only to position the dye in close proximity to the surface bound PS emission centers but also to promote its interaction. The most pronounced interaction is manifest for those samples treated in DODCI. The effects observed for both DODCI and Rhodamine 700 are greatest for those samples treated after aqueous etching.

A histogram with delays ranging from 0.5 to 61.5 μs (5 μs gate) for the DODCI treatment of an aqueous etched sample shows a convergence to a dominant feature peaking at about 650 nm. By comparison, a histogram of the PL for time delays of 0.5 to 11.5 μs (5 μs gate) demonstrates the evolution observed for an untreated aqueous etched sample. The DODCI treated sample is distinct, displaying initially both a "green" emission feature and an "orange-red-red" emission feature which at first appear to "bookend" the observed aqueous etch emission features. With increased delay time, the green emission feature red shifts and the red emission feature appears to split into two features, one of which blue shifts with increased delay time and a second peak which appears almost stationary in time. This gives the appearance of a triple peaked spectrum for time delays ranging from 7.5 to 23.5 μs. After a 27.5 μs delay, the shifting short wavelength and orange-red features have virtually merged into each other to form a dominant peak at about 640 nm which eventually red shifts by about 10 nm. The observed spectra after 27.5 μs suggest that the continued red shifting of the initially green emission feature somewhat dominates the observed time dependence. The peak spectral intensity observed in a given histogram remains virtually constant out to 33.5 μs.

The interaction of Rhodamine 700 with an aqueous etched PS substrate sample appears to be much less pronounced than that for DODCI. The shifting green and orange-red emission features have merged in the 7.5 μs delay scan to a dominant spectral peak at 640 nm which red shifts to 650 nm by 21.5 μs. Further, the drop off in spectral intensity occurs considerably more rapidly.

In another histogram obtained for a DODCI treated hybrid etched sample, initially soaked for 45 minutes in a $10^{-3}$ M dye solution, the dye has a clear affect on the hybrid etched sample although not as pronounced as that on the aqueous etched sample. Further, the extended period of exposure to the dye is required as a hybrid sample simply dipped in DODCI is found to rapidly converge to a strongly dominant 630–640 nm feature indicative of the untreated hybrid etch. In another histogram, the PL for the DODCI treated sample is compared to the evolution for an untreated hybrid etch sample for time delays of 0.5 to 9.5 μs (5 μs gate). The histograms display the cycle of convergence for the red shifting "green" and blue shifting "orange-red" emission features. However, the appearance of the triple peaked spectrum ($\tau_{delay}$~3.5 μs) and the time delay corresponding to the merging of the shorter wavelength and orange-red emission features to a dominant 630 nm (peak) feature, ~11.5 μs, occur on a considerably shorter time scale. The spectral intensity of the DODCI treated sample begins to drop off rapidly for time delays longer than 17.5 μs, converging to a final peak wavelength for the dominant feature at 650 nm.

A further histogram for a Rhodamine 700 treated hybrid etched sample suggests that even a 45 minute exposure has only a small effect. In fact, the convergence of the spectral features to a dominant single peak appears to occur even more rapidly than the untreated sample over the range of delay times 3.5 μs or less. A significant drop off in spectral intensity is observed to occur for time delays longer than 7.5 μs.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A post-etch method of enhancing and stabilizing the photoluminescence from a porous silicon substrate, comprising the steps of:

treating the porous silicon substrate with an aqueous hydrochloric acid solution; and treating the porous silicon substrate with an alcohol.

2. The method of claim 1, wherein the step of treating the porous silicon substrate includes treating a porous silicon substrate that has a microporous framework on which is superimposed a nanoporous layer.

3. The method of claim 1, wherein the step of treating the porous silicon substrate with an alcohol further comprises the step of treating the porous silicon substrates with methanol.

4. The method of claim 1, wherein the step of treating the porous silicon substrate with the dilute aqueous hydrochloric acid further includes a step of treating the porous silicon substrate with at least a 0.2 molar aqueous hydrochloric acid solution.

5. A post-etch method of enhancing and stabilizing the photoluminescence from a porous silicon substrate, comprising the step of treating the porous silicon substrate with an aqueous hydrochloric acid and alcohol solution.

6. The method of claim 5, wherein the step of treating the porous silicon substrate includes treating a porous silicon substrate that has a microporous framework on which is superimposed a nanoporous layer.

7. The method of claim 5, wherein the step of treating the porous silicon substrate with the dilute aqueous hydrochloric acid and alcohol solution further includes the step of treating the porous silicon substrate with an aqueous hydrochloric acid and methanol solution.

8. The method of claim 5, wherein the step of treating the porous silicon substrate with the dilute aqueous hydrochloric acid and alcohol solution further includes a step of treating the porous silicon substrate with at least a 0.2 molar aqueous hydrochloric acid and alcohol solution.

9. A post-etch method of electroless metallization of a porous silicon substrate, comprising the steps of:
   treating the porous silicon substrate with an aqueous hydrochloric acid solution;
   treating the porous silicon substrate with an alcohol;
   treating the porous silicon substrate with a hydrazine solution to remove fluorides from the porous silicon;
   introducing a metal-containing electroless solution;
   illuminating the porous silicon substrate with a light source at wavelengths less than about 750 nanometers to cause photoluminescence of the porous silicon substrate; and
   metallizing the porous silicon substrate wherein photoluminescence is capable of causing metallization of the porous silicon substrate with the metal of the metal-containing solution.

10. The method of claim 9, wherein the step of treating the porous silicon substrate includes treating a porous silicon substrate that has a microporous framework on which is superimposed a nanoporous lager.

11. The method of claim 9, wherein the step of treating the porous silicon substrate with an alcohol further includes the step of treating the porous silicon substrates with methanol.

12. The method of claim 9, wherein the step of treating the porous silicon substrate with the dilute aqueous hydrochloric acid further includes a step of treating the porous silicon substrate with at least a 0.2 molar aqueous hydrochloric acid.

13. The method of claim 9, wherein the step of illuminating the porous silicon substrate with the light source at wavelengths less than 750 nanometers further includes the step of illuminating the porous silicon substrate with a Xenon arc lamp light source at wavelengths less than 750 nanometers.

14. The method of claim 9, wherein the step of illuminating the porous silicon substrate with the light source at wavelengths less than 750 nanometers further includes the step of illuminating the porous silicon substrate with a Helium Neon laser light source at wavelengths less than 750 nanometers.

15. A post etch method of electroless metallization of porous silicon substrate, comprising the steps of:
   treating the porous silicon substrate with an aqueous hydrochloric acid and alcohol solution;
   treating the porous silicon substrate with a hydrazine solution to remove fluorides from the porous silicon;
   introducing a metal-containing solution;
   illuminating the porous silicon substrate with a light source at wavelengths less than about 750 nanometers to cause photoluminescence of the porous silicon substrate; and
   metallizing the porous silicon substrate wherein photoluminescence is capable of causing metallization of the porous silicon substrate with the metal of the metal-containing solution.

16. The method of claim 15, wherein the step of treating the porous silicon substrate includes treating a porous silicon substrate that has a microporous framework on which is superimposed a nanoporous layer.

17. The method of claim 15, wherein the step of treating the porous silicon substrate with the dilute aqueous hydrochloric acid and alcohol solution further includes the step of treating the porous silicon substrate with an aqueous hydrochloric acid and methanol solution.

18. The method of claim 15, wherein the step of treating the porous silicon substrate with the dilute aqueous hydrochloric acid and alcohol solution further includes a step of treating the porous silicon substrate with at least a 0.2 molar aqueous hydrochloric acid and alcohol solution.

19. The method of claim 15, wherein the step of illuminating the porous silicon substrate with the light source at wavelengths less than 750 nanometers further includes the step of illuminating the porous silicon substrate with a Xenon arc lamp light source at wavelengths less than 750 nanometers.

20. The method of claim 15, wherein the step of illuminating the porous silicon substrate with the light source at wavelengths less than 750 nanometers further includes the step of illuminating the porous silicon substrate with a Helium Neon laser light source at wavelengths less than 750 nanometers.

21. The method of claim 15, further including the step of forming a metallized porous silicon substrate that has a resistance of about 20 ohms to about 1000 ohms.

22. The method of claim 15, further including the step of forming a metallized porous silicon substrate that has a resistance of about 20 ohms to about 500 ohms.

23. The method of claim 15, further including the step of forming a metallized porous silicon substrate that has a resistance of about 20 ohms to about 60 ohms.

24. A post etch method of enhancing photoluminescence from a porous silicon substrate that has a microporous framework on which is superimposed a nanoporous layer, comprising the step of treating the porous silicon substrates with a dye, wherein the dye is selected from the group consisting of: Rhodamine dye compounds; 3,3'-diethyloxadicarbocyanine iodide; Fluorocein; and dicyanomethylene dye compounds.

25. The method of claimed 24, wherein the porous silicon substrate has a microporous framework on which is superimposed a nanoporous layer.

* * * * *